United States Patent
Mulrooney et al.

[11] Patent Number: 6,062,095
[45] Date of Patent: May 16, 2000

[54] DUAL COMPARTMENT INSTRUMENT HOUSING

[75] Inventors: Michael J. Mulrooney, Batavia; Boyce M. Carsella, Ingleside, both of Ill.

[73] Assignee: Magnetrol International, Downers Grove, Ill.

[21] Appl. No.: 09/094,142

[22] Filed: Jun. 9, 1998

Related U.S. Application Data

[60] Provisional application No. 60/048,997, Jun. 9, 1997.

[51] Int. Cl.7 ............................ G01D 21/00; G01F 23/00; G01F 1/68
[52] U.S. Cl. .................... 73/866.5; 73/204.22; 73/304 R
[58] Field of Search .............................. 73/204.22, 866.5, 73/431, 493, 290 R, 290 V, 861.42, 304 R; 340/870.21; 333/254, 260, 261, 346

[56] References Cited

U.S. PATENT DOCUMENTS

| | | | |
|---|---|---|---|
| 4,466,283 | 8/1984 | Osterhout | 73/431 |
| 4,608,763 | 9/1986 | Manns et al. | 33/561 |
| 4,791,363 | 12/1988 | Logan | 333/346 |
| 4,821,585 | 4/1989 | Kempe | 73/866.5 |
| 5,546,804 | 8/1996 | Johnson et al. | 73/866.5 |
| 5,661,251 | 8/1997 | Cummings et al. | 73/866.5 |
| 5,703,289 | 12/1997 | Mulrooney | 73/290 V |
| 5,710,552 | 1/1998 | McCoy et al. | 340/870.21 |
| 5,851,083 | 12/1998 | Palan | 333/254 |

*Primary Examiner*—Harshad Patel
*Attorney, Agent, or Firm*—Woods, Phillips, VanSanten, Clark & Mortimer

[57] ABSTRACT

A dual compartment housing has a wiring compartment containing customer accessible wiring board and openings for a conduit connection. The wiring compartment is separated from an electronics compartment by a tunnel. The tunnel, which can be potted with a sealing compound, provides environmental and explosion proof protection for the electronics. An intrinsically safe barrier can be housed in the explosion proof wiring compartment, and the electronics compartment is then intrinsically safe. This relieves any constraint on separating the intrinsically safe electronics exposed to the process by an explosion proof boundary, and the process seal can be a "soft" seal. The housing is designed so that both compartments face the same direction.

21 Claims, 8 Drawing Sheets

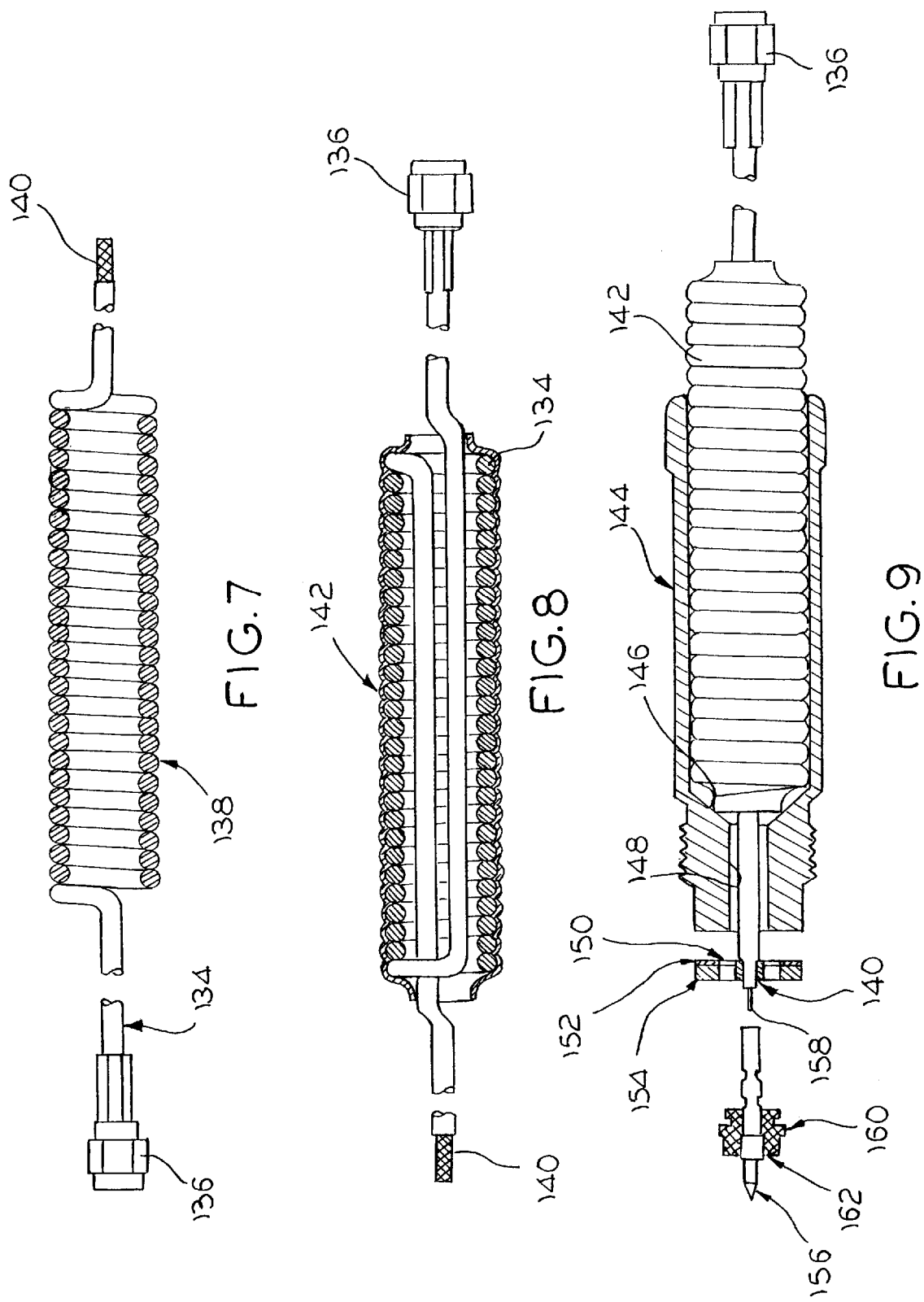

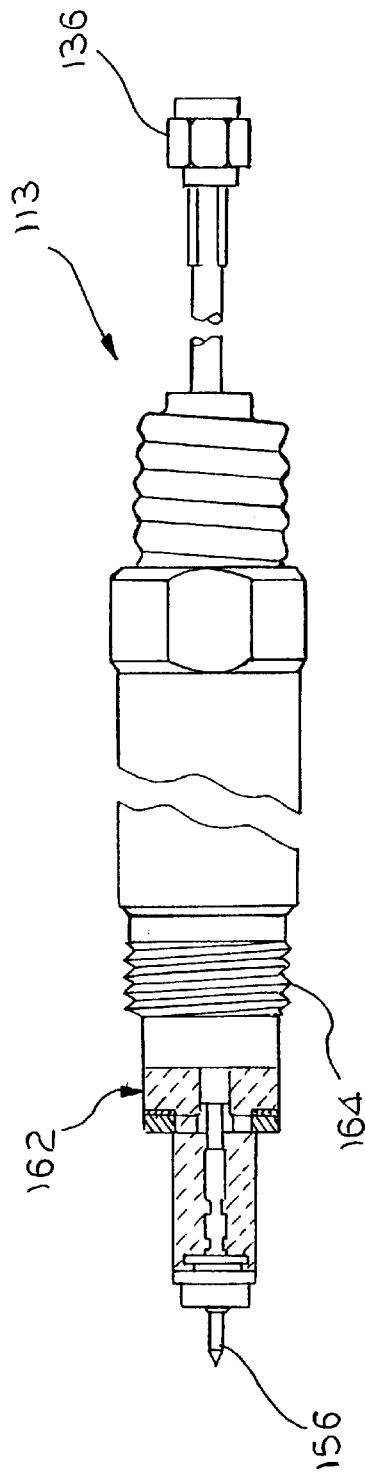
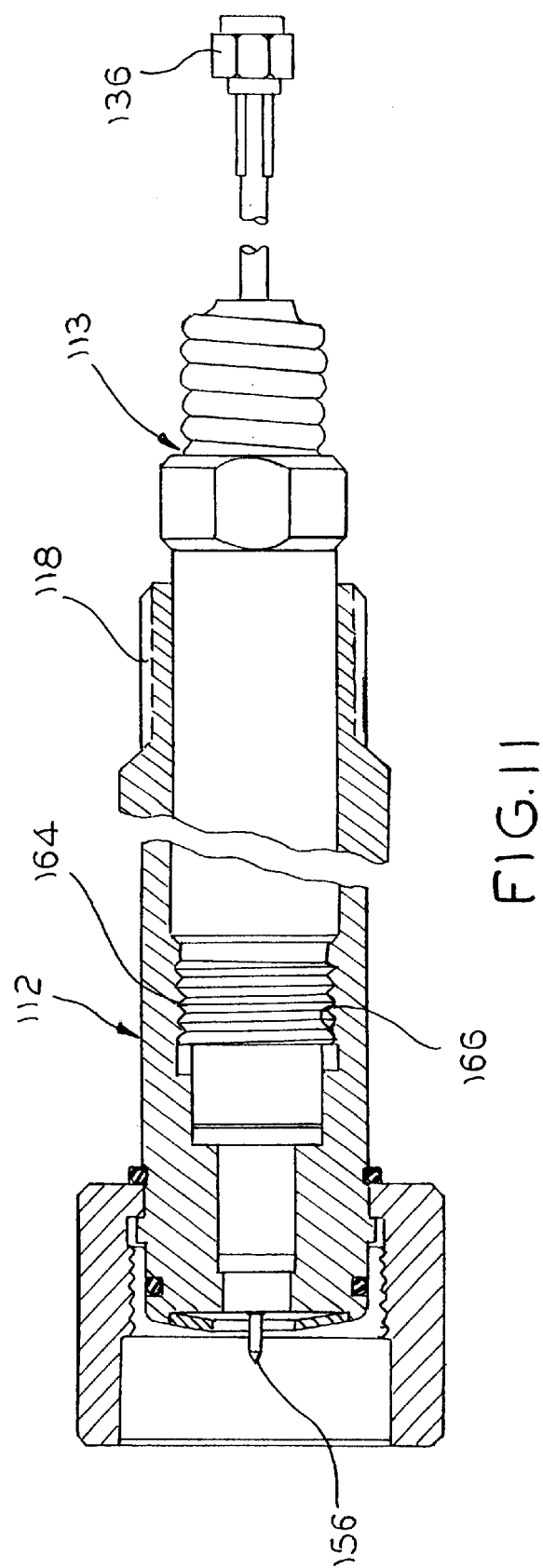
FIG.10
FIG.11

DUAL COMPARTMENT INSTRUMENT HOUSING

This application claims the benefit of U.S. provisional application No. 60/048,997, filed Jun. 9, 1997.

FIELD OF THE INVENTION

This invention relates to instrumentation products and, more particularly, to a dual compartment instrument housing.

BACKGROUND OF THE INVENTION

Process instruments, such as used for sensing of process variables, for example, level or the like, include a sensing element and a control element. The sensing element may be, for example, a probe secured to and extending into a vessel or a non-contact element sensing from the top of the vessel. The control element is usually located in a housing. The housing may be physically secured to the probe or may be remotely located from the probe. In either case, the probe is electrically connected to the control element. The control housing includes electrical or electronic components used to sense a process variable. Some control electronics provide only local indication. Others transmit either a discrete on/off signal or a varying analog signal to remote control systems. In either case, electrical connections must be provided to the control electronics for power and/or signalling.

In some applications it is desirable to isolate customer accessible wiring for providing wiring to remote controls and/or power from the control electronics which is connected to the probe. One known type of transmitter uses a dual compartment housing comprising a cylindrical housing having a central circular wall separating the housing into two compartments. A control or electronics compartment of the housing is accessible from one side, while a wiring compartment is accessible from an opposite side of the housing. Such design prevents a user from accessing both compartments simultaneously. Also, depending on orientation, it may be difficult to obtain easy access to one or both compartments.

One particular type of process instrument comprises a microwave level sensing transmitter. Such a transmitter uses a probe which provides a high frequency transmission line positioned in the fluid. The probe is connected to control electronics in a control housing. Difficulties occur in impedance matching between the probe and the control electronics.

The present invention is directed to overcoming one or more of the problems discussed above in a novel and simple manner.

SUMMARY OF THE INVENTION

In accordance with the invention there is provided a dual compartment instrument housing providing access to dual compartments from a single side.

In accordance with another aspect of the invention there is provided a high frequency electrical connector providing improved impedance matching.

Particularly, the dual compartment housing has a wiring compartment containing customer accessible wiring board and openings for conduit connections. The wiring compartment is separated from an electronics compartment by a tunnel. The tunnel, which can be potted with a sealing compound, provides environmental protection for the electronics. It can also provide explosion proof protection. An intrinsically safe barrier can be housed in the explosion proof wiring compartment, and the electronics compartment is then intrinsically safe. This relieves any constraint on separating the intrinsically safe electronics in the process by an explosion proof boundary, and the process seal can be a "soft" seal.

The geometry of the dual compartment housing is designed such that both compartments face the customer for ease of access. This provides ease of wiring. Also, ease of viewing the display and/or accessing the keypad contained in the electronics compartment. The housing is angled to allow viewing the display while standing. Moreover, a 360° rotatable union fitting in the housing ensures that the instrument is optimally oriented in all circumstances.

An industrial style coax connector is provided for transmitting high frequency signals in an industrial environment. The connector transmits a signal from the control electronics to a process sensing probe, which is an industrial transmission line. For certain technologies it is critical for this to be done at a specific impedance. The connector matches the coax connector cable $50\Omega$ with a coax type style probe antenna of $50\Omega$. The connector is designed so that the impedance can be modified by internal geometry to match other probe characteristic impedance.

Half of the high frequency connector is uniquely contained in the electronics enclosure, and the other half in the process probe. As such, the probe can be installed in a vessel, completely sealing the process within the vessel. Thus, the dual compartment housing, containing the electronics, need not be present to seal the process. This allows removing the entire instrument electronics if necessary for servicing without shutting down the process.

The housing can be attached to the probe and the electrical connection made simply by inserting a male connector half into a female connector half and hand tightening a union connector.

Further features and advantages of the invention will be readily apparent from the specification and from the drawings.

BRIEF DESCRIPTION OF THE DRAWING

FIGS. 7–10 illustrate a sequence of assembly of the connector subassembly according to the invention;

FIG. 11 is a sectional view illustrating the assembly of the connector according to the invention and including the subassemblies of FIGS. 6 and 10.

DETAILED DESCRIPTION OF THE INVENTION

Figure 1:
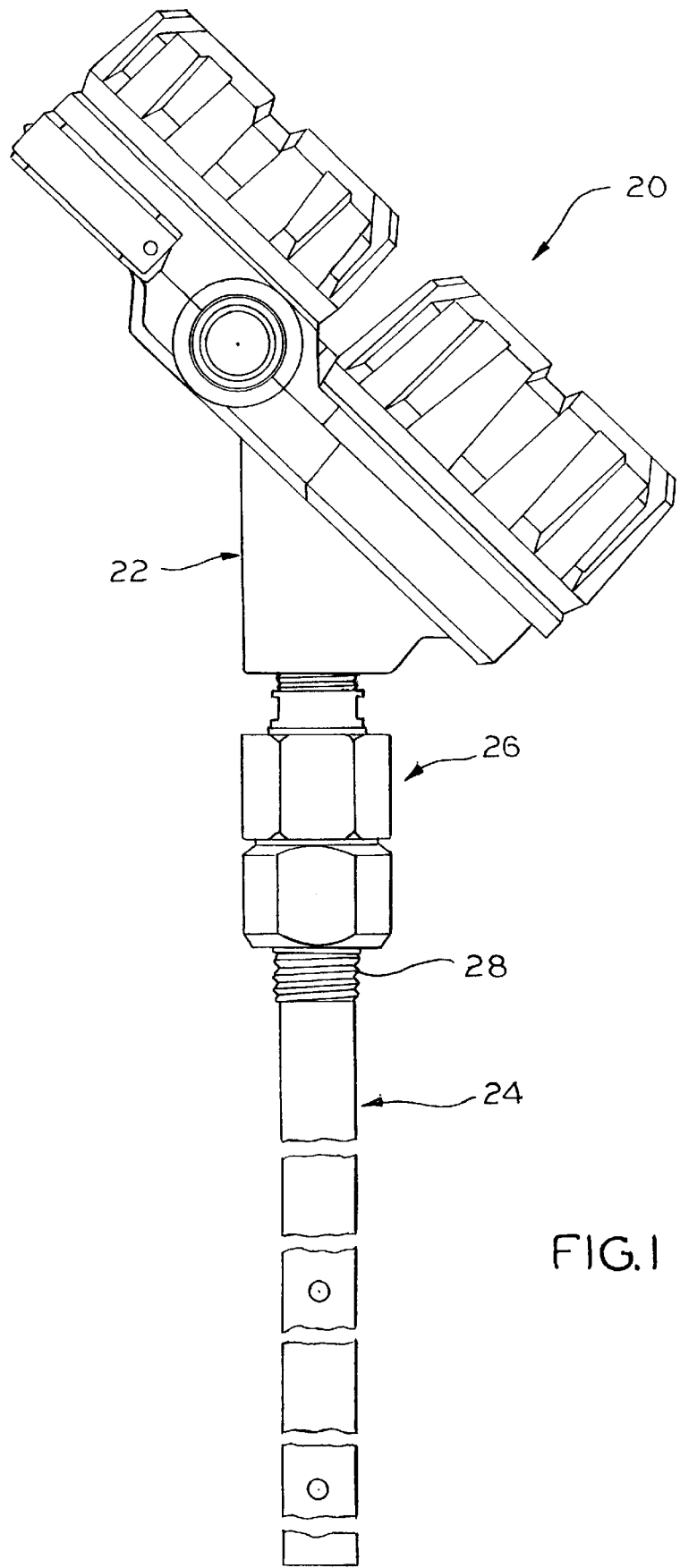
FIG. 1 is a side elevation view of a process instrument including a dual compartment housing according to the invention.

Referring to FIG. 1, a process instrument 20 according to the invention is illustrated. The process instrument 20 comprises a microwave level sensing transmitter. The instrument uses guided wave radar for sensing level. While the embodiment described herein relates to a microwave level sensing apparatus, various aspects of the invention may be used with other types of process instruments for measuring various process parameters.

The process instrument 20 includes a control housing 22, a probe 24, and a connector 26 connecting the probe 24 to the housing 22. The probe 24 is typically mounted to a process vessel (not shown) using a threaded fitting 28. The housing 22 is then secured to the probe 24 as by threading the connector 26 to the probe 24 and also to the housing 22. As described below, the probe 24 comprises a high frequency transmission line which, when placed in a fluid, can be used to measure level of the fluid. Particularly, the probe 24 is controlled by electronics in the housing 22 for determining level in the vessel.

Figure 2:
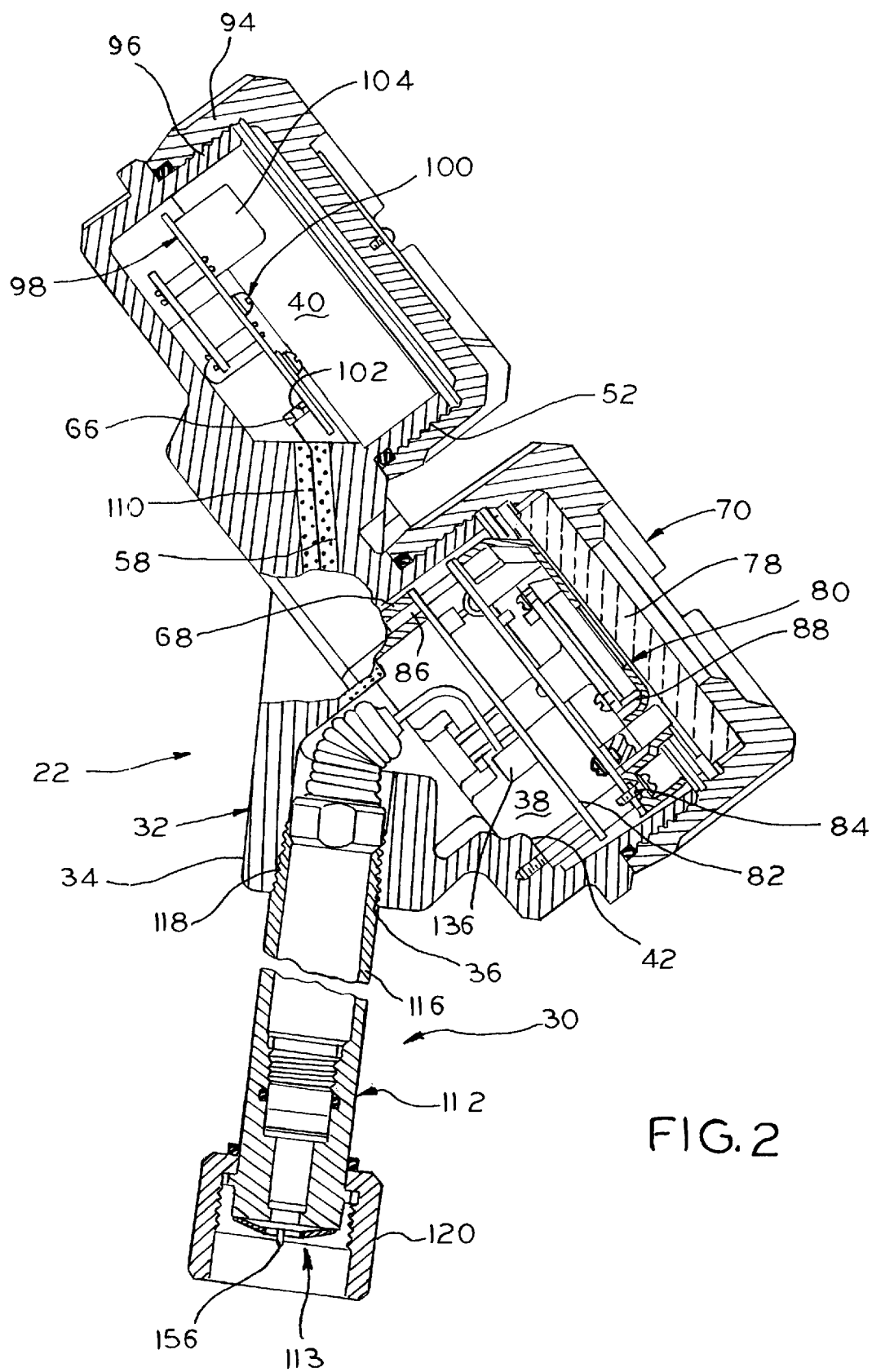
FIG. 2 is a sectional view of a process instrument according to the invention including the dual compartment housing of FIG. 1 and a high frequency connector according to the invention.
Figure 3:
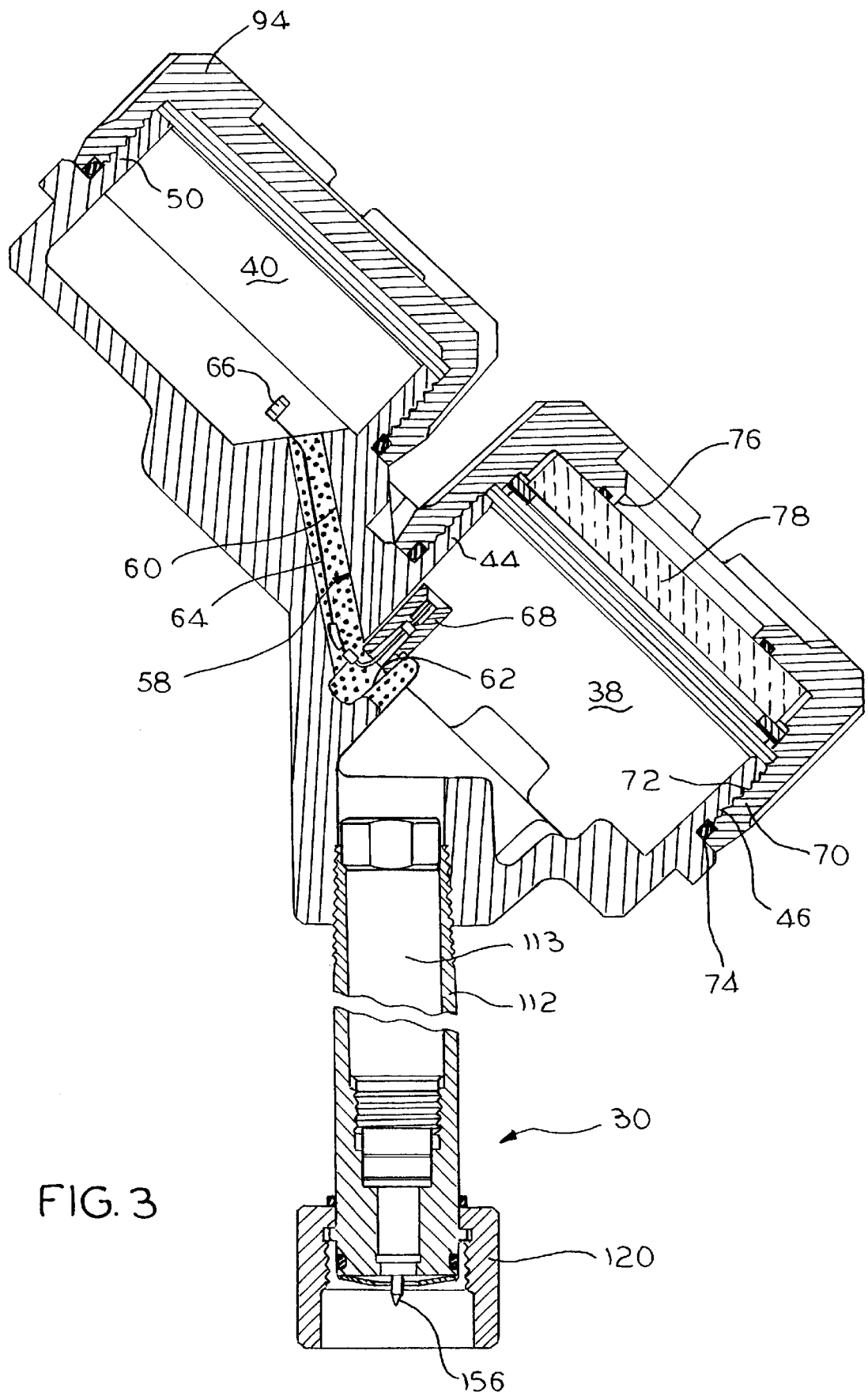
FIG. 3 is a sectional view similar to that of FIG. 2 with parts removed for clarity.
Figure 4:
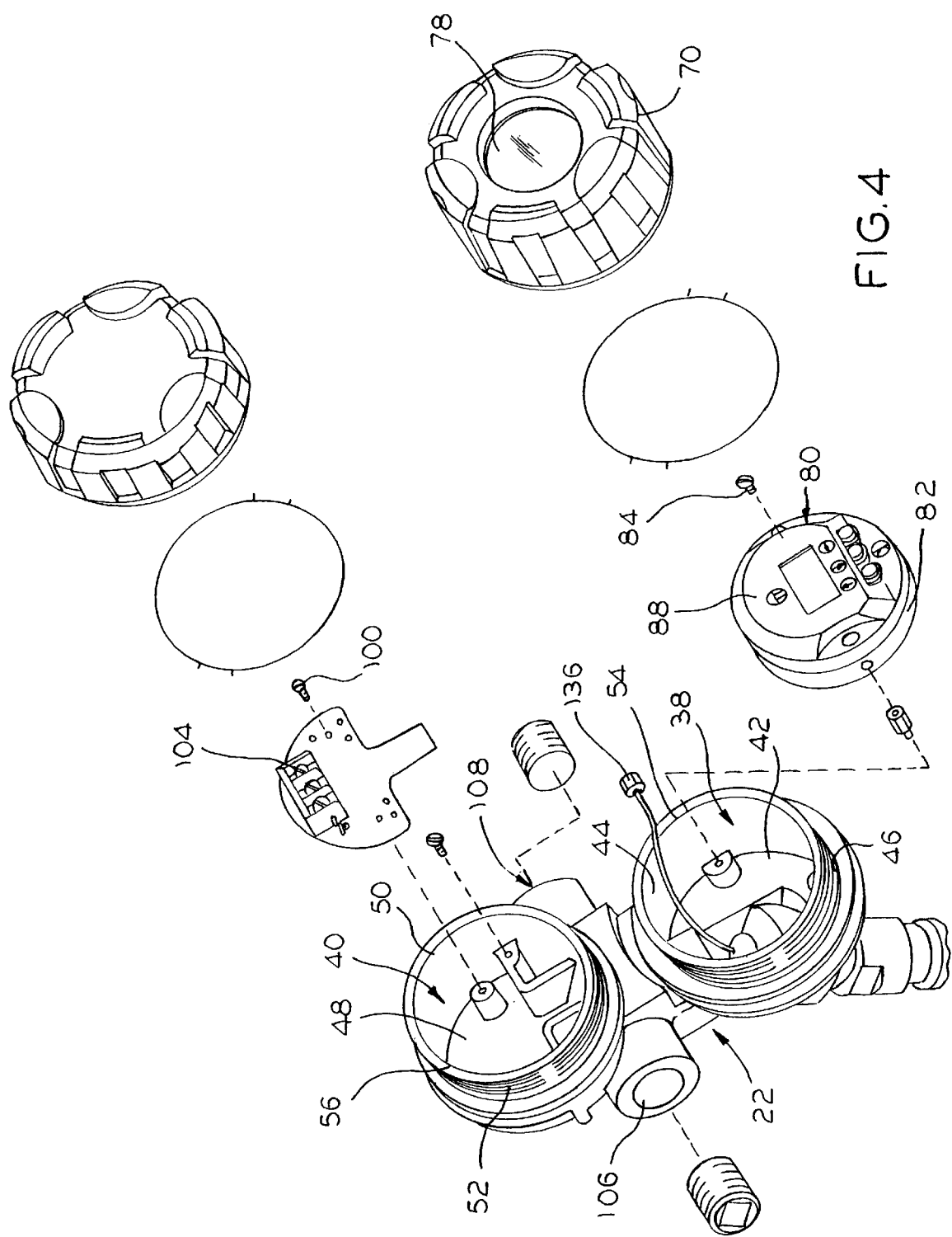
FIG. 4 is an exploded view of the process instrument of FIG. 2.

Referring to FIGS. 2–4, the housing 22 is illustrated along with a longer version of a high frequency connector 30 according to the invention.

The housing 22 includes a base assembly 32. The base assembly 32 is of cast construction and includes a cylindrical collar 34 having a threaded cylindrical through opening 36 for receiving the connector 30. The base assembly 32 includes an electronics compartment 38 and a wiring compartment 40. The wiring compartment 40 is defined by a bottom wall 42 and a cylindrical side wall 44 threaded on its outside at 46. The electronics compartment 38 is in communication with the collar opening 36 which opens into the bottom wall 42. The wiring compartment 40 is also defined by a bottom wall 48 and a cylindrical side wall 50. The cylindrical side wall 50 is threaded on its outside at 52. As illustrated, the two cylindrical side walls 46 and 50 are oriented with parallel axes. An opening 54 to the electronics compartment 38 faces the same direction as a corresponding opening 56 of the wiring compartment 40. The opening 54 is defined by an outer edge of the cylindrical side wall 44. The opening 56 is defined by an outer edge of the cylindrical side wall 50. The opening 54 is in a plane which is coplanar to the opening 56. These planes are also at a 45° angle relative to an axis of the collar through opening 36.

A tunnel opening 58 connects the electronics compartment 38 to the wiring compartment 40. The tunnel 58 is defined by an angled portion 60 connected to the wiring compartment 40. The angle is selected so that the tunnel portion 60 can be formed by boring through the wiring compartment 40 during assembly while clearing the tubular side wall 50, as illustrated. A second portion 62 opening to the electronics compartment 38 is generally tangential to the electronics compartment side wall 44. As is particularly illustrated in FIG. 3, a wiring harness 64 passes through the tunnel 58. The wiring harness 64 includes a header 66 which floats in the wiring compartment 40. The header 66 is connected via lead wires to a header 68 fixedly mounted in the electronics compartment 38 oriented generally tangentially to the side wall 44. The header 68 guides an electronics module 80, described below, into place, and makes electrical contact.

The electronics compartment 38 is selectively closed with a first cover 70 threaded to the threaded outer wall 46 via a threaded inner wall 72. The connection is sealed with an O-ring 74. The cover 70 includes a through opening 76 closed by glass 78, which can be explosion proof, so that the electronics module 80 is viewable through the glass 78.

Figure 5:
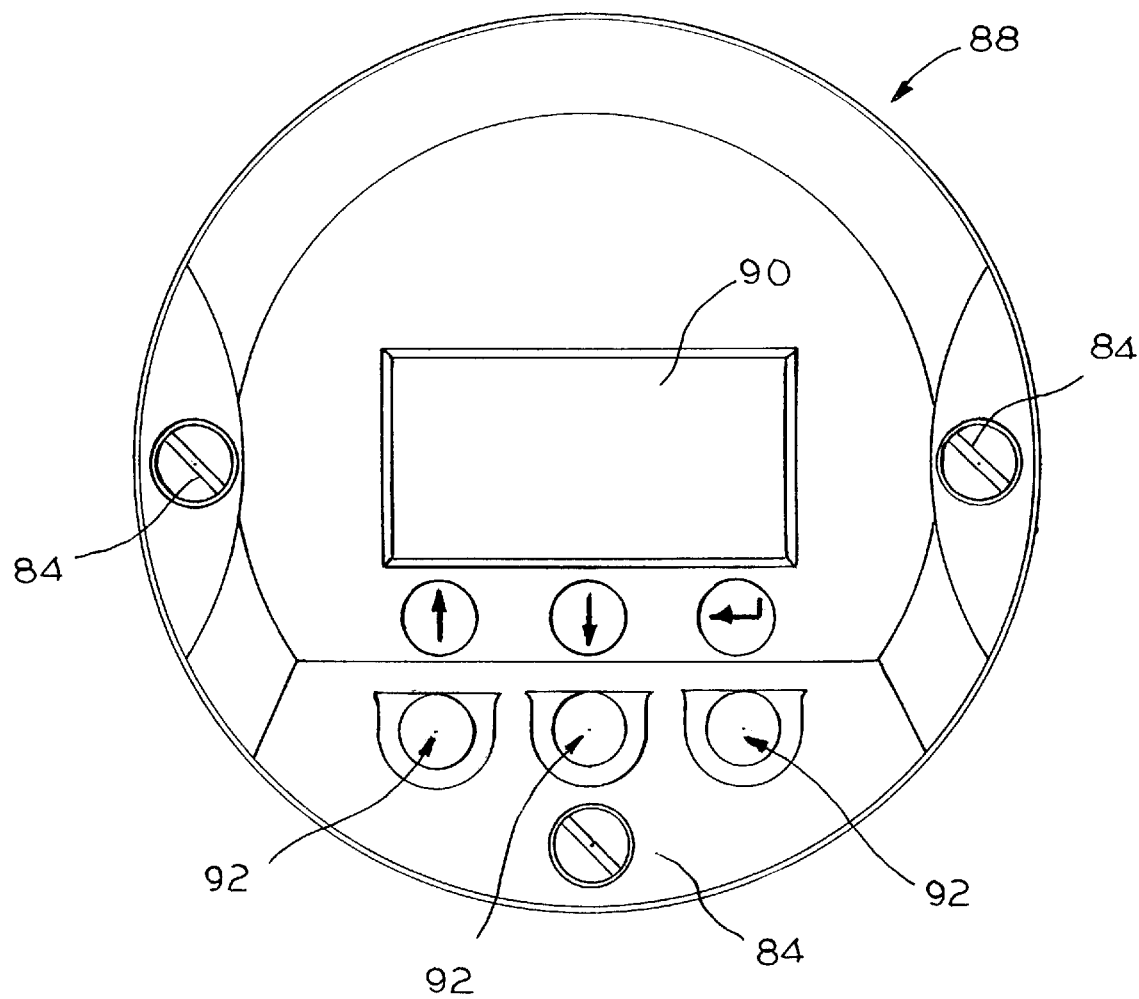
FIG. 5 is a front elevation view of a user display and keypad interface of the process instrument of FIG. 2.

Referring particularly to FIG. 2, the electronics module 80 comprises a printed circuit board 82 secured to the bottom wall 42 via fasteners 84. Extending downwardly from the board 82 is a connector 86 which incident to inserting the circuit board 82 in the electronics compartment 38 is received in the header 68. This provides connection via the wiring harness 64 to the wiring compartment 40. An operator interface panel 88 is secured to the circuit board 82, as illustrated in FIG. 5, and includes a display 90 and push buttons 92. As configured, the display 90 is viewable through the glass 78 during normal operation. The push buttons 92 can be accessed by removing the cover 70, as is apparent.

The wiring compartment 40 is selectively closed by a second cover 94 having an inner threaded wall 96 threaded to the threaded wall 52. The cover 94 completely closes the second compartment 40, that is, there is no window provided. A wiring board assembly 98 is secured in the wiring compartment 40 using a screw 100. The header 66 is connected to the wiring board assembly 98, as illustrated at 102. The wiring board assembly 98 includes a terminal board 104 for connection to remote control devices, and/or power. Access to the wiring compartment 40 is made via conduit openings 106 and 108. Thus, the remote wiring is effectively connected to the electronics control circuit board via the wiring harness 58 and the wiring board assembly 98.

With the housing 22 as described, the two compartments 38 and 40 are separate but connected through the tunnel 58. The wiring compartment 40 has openings 106 and 108 for conduit feeds. The electronics compartment 38 contains the electronics module 80. The two compartment housing 22 mounts to the connector 30, which is in turn connected to a probe 24.

The tunnel 58 can be sealed with an epoxy casting 110. Owing to the physical relationship between the covers 70 and 94 and the base 32, the housing 22 can be explosion proof. Because the two compartments 38 and 40 are sealed from one another with the potting compound 110, the two compartments can be individually explosion proof.

The housing 22 offers a customer easy wiring access. The wiring compartment 40 is positioned in such a way that it is angled toward an operator and in a plane which is most easily accessible. The ergonomics of the electronics module 80 is also optimized. The display 90 is positioned at an angle so that it can be read by an operator standing above the housing 22. The keypad 92 is positioned below the display 90 so that the keys 92 are easily accessible.

Figure 6:
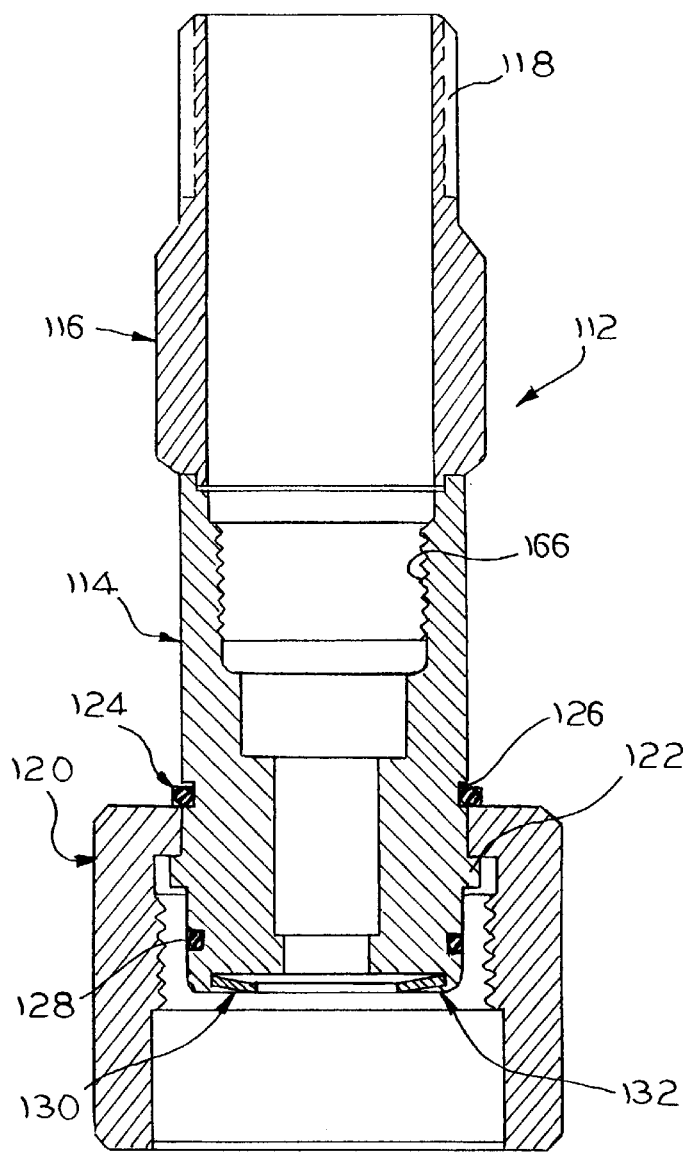
FIG. 6 is a sectional view of a connector subassembly according to the invention.

Referring to FIG. 2, the connector 30 includes first and second connector subassemblies 112 and 113, respectively. The first connector subassembly 112 is illustrated in FIG. 6 and comprises a coax connector sleeve 114 welded to a connector extension 116. The connector extension 116 is threaded as at 118 to be threaded to the collar threaded opening 36, see FIG. 2. A union nut 120 of conventional construction is received on an annular shoulder 122 of the coax connector sleeve 114. The union nut 120 is sandwiched between the shoulder 122 and an external ring 124 received in an annular groove 126. An O-ring 128 provides a seal when the connector 30 is secured to a probe. A disk spring 130, which serves as a compressive lock washer, is secured to the coax connector sleeve 114 which is rolled over as at 132, also used in connecting to the probe 124, as discussed below.

The second subassembly 113 is particularly illustrated in FIG. 10. Reference is made to FIGS. 7–10, which illustrate in sequence the assembly of the subassembly 113.

Referring initially to FIG. 7, a cable assembly 134 having a connector 136 at one end is wound in a coil 138. The coil 138 includes twenty-four turns. The cable 134 is a coaxial cable approximately four foot in length. After being wound into a coil 138, the connector 136 is returned through the coil 138 at an opposite end and an exposed end 140 is likewise inserted back through the coil 138, as illustrated in FIG. 8. A heat shrink tubing 142 is then placed around the coil 138.

Referring to FIG. 9, the coil 138 with the heat shrink tubing 142 is inserted lengthwise into a connector bushing 144, where it abuts against a counterbore 146. The end 140 extends through a through bore 148 adjacent the counterbore 146. A braid 150 of the cable 134 is spread against a washer 152 which is seated on a connector spacer 154. A center pin 156 is then electrically connected to a center conductor 158 of the cable 134. A connector insulator 160 is glued to the center pin 156 as at 162. Referring to FIG. 10, a polyurethane adhesive 162 is then applied between the connector insulator 160 and the connector spacer 154 and between the connector spacer 154 and the connector bushing 144 to provide the second subassembly 113. The second subassembly 113 is then inserted in the first subassembly 112 and a threaded wall 164 is threaded into a corresponding threaded inner wall 166 of the coax connector sleeve 114.

The connector 30 is secured to the housing 22 as by threading the connector extension 116 into the collar 34, as illustrated in FIG. 2. The housing assembly 22 with the connector 30 can thereafter be simply mounted to a probe, as described below.

Figure 12:
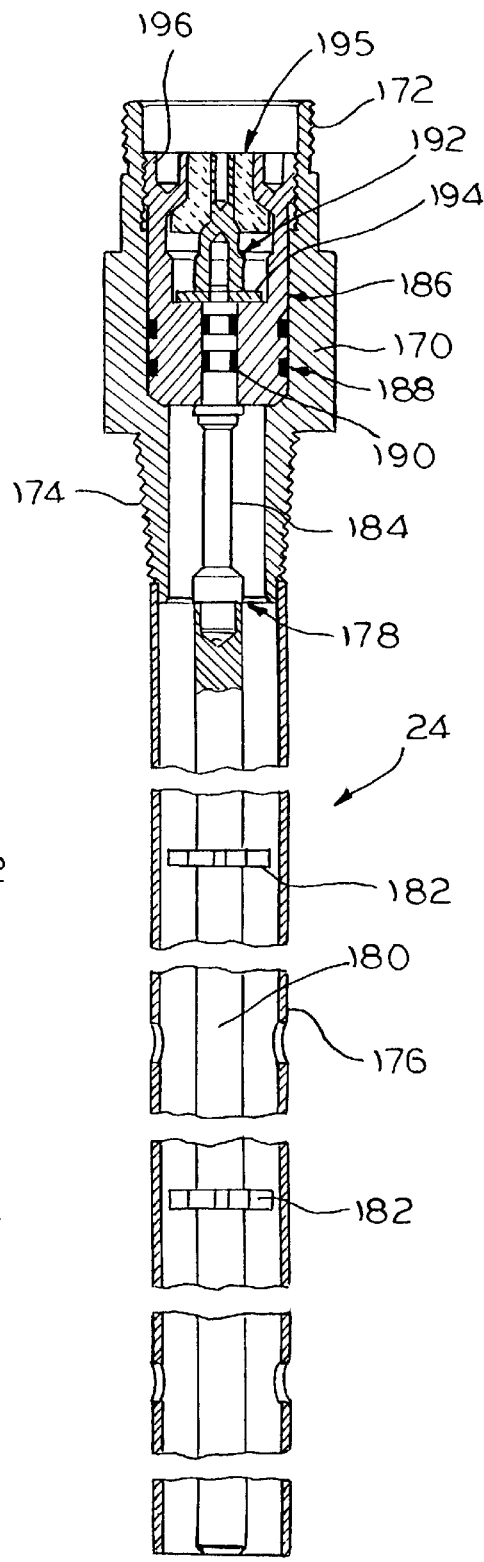
FIG. 12 is a sectional view of a probe used with the instruments of FIGS. 1 and 2.

Referring to FIG. 12, the probe 24 is illustrated in greater detail. A fitting 170 is threaded at an upper end 172 for mating with the union nut 120, see FIG. 2. The fitting 170 can have an NPT thread at a lower end 174 for securing the probe 24 to a process vessel. An outer sleeve 176 is connected to the fitting 170 at 178. A transmission line 180 extends through the sleeve 176 and is separated from the sleeve using spacers 182. The length of the transmission line 180 and sleeve 176 depend on the particular application but each are of approximately equal length, as illustrated. A connector 184 secured to the transmission line 180 is received in a Teflon process seal 186 within the fitting 170. O-rings 188 provide a seal between the Teflon process seal 186 and the fitting 170. Similarly, O-rings 190 provide a seal between the Teflon process seal 186 and the connector 184. The connector 184 terminates at a female connector pin 192. A flat washer 194 is disposed between the center pin 192 and the process seal 186. An insulating bushing 195 centers the center pin 192 and is held in place with a lock nut 196. The connector 30 provides a quick connect/disconnect with the probe 24. Particularly, the connector 30 is positioned over the probe 24 and lowered so that the male center pin 156, see FIG. 2, is received in the female center pin 192, see FIG. 12, to provide electrical connection. The union nut 120 then tightens to the fitting 170 in a conventional manner. However, owing to the use of the union fitting, the housing 22 can be rotated 360° to take full advantage of compartment accessibility. With the connector 30 connected to the probe 24 the coax connector 136 is electrically connected via the cable 134 to the probe. Referring again to FIG. 2, the connection from the probe 24 to the printed circuit board 82 is completed by connecting the coax connector 136 to the board 82 as illustrated.

Thus, in accordance with the invention a user is provided ready access to both compartments 38 and 40 from one side, as illustrated in FIG. 4. The union connection allows the housing 22 to be rotated to any desired direction to further facilitate use. Each of the compartments 38 and 40 is independently explosion proof. Thus, an operator can perform tuning and the like by removing the electronics compartment cover 70 without interfering with wiring connections in the wiring compartment 40.

Further, the probe 24 when mounted to a vessel provides a process seal. Thus, the housing 22 and connector 30 can be removed while maintaining the process seal.

With the construction as described, the probe 24 is a high frequency transmission line inserted in fluid. The probe 24 acts as a twin lead transmission line between leads being formed by the sleeve 176 and probe shaft 180. The control electronics typically have an impedance of approximately 50Ω. The probe 24 could have a different impedance. The connector 30 must maintain a constant 50Ω feedthrough at high frequencies while providing an industrialized type connection. The geometry described satisfies the requirements. Particularly, the spacing of the signal carrier from the ground plane maintains impedance along with a delay line in the form of the use of the four foot of coaxial cable.

We claim:

1. In a process instrument having a sensor for sensing a process variable, an instrument housing operatively connectable to the sensor comprising:

a base having first and second compartments separated by a wall, with a passage through the wall connecting the first and second compartments, each compartment having an access opening with both access openings facing in a same direction, the first compartment housing a control circuit for connecting to the sensor, the second compartment housing terminals for connection to external controls, the control circuit being connected to the terminals via a conductor passing through the passage, and a through opening in the first compartment for operatively mounting to the sensor; and first and second covers for selectively closing the respective first and second compartment access openings.

2. The instrument housing of claim 1 wherein the through opening comprises a cylindrical opening defining a cylindrical axis and wherein the axis is at approximately a forty-five degree angle relative to a plane of the access openings.

3. The instrument housing of claim 1 wherein a connector is mounted to the through opening, the connector having a union nut for threading to the sensor at any angular orientation.

4. The instrument housing of claim 1 wherein the passage is sealed with an epoxy sealant.

5. The instrument housing of claim 1 wherein the base includes a conduit opening into the second compartment.

6. The instrument housing of claim 1 wherein the first cover includes a through opening closed by a glass cover so that a display of said control circuit is visible.

7. In a microwave level sensing process instrument having a probe in the form of a transmission line for sensing level in a vessel, an instrument housing operatively connectable to the probe comprising:

a base having a compartment with an access opening, the compartment housing a control circuit for electrically connecting to the probe, and a through opening for electrically connecting the control circuit to the probe;

a high frequency connector mounted to the base at the opening and to the probe, the connector having a sleeve with a cable therein wound in a coil, a first end of the cable being connected to the control circuit and a second end of the cable being connected to the probe; and a cover for selectively closing the access opening.

8. The instrument housing of claim 7 wherein probe comprises a coaxial probe and the cable comprises a coaxial cable.

9. The instrument housing of claim 7 wherein the cable comprises a shielded cable.

10. The instrument housing of claim 7 wherein the cable is approximately four feet in length.

11. The instrument housing of claim 7 wherein the connector has a union nut for threading to the sensor at any angular orientation.

12. In a microwave level sensing process instrument having a probe in the form of a transmission line for sensing level in a vessel, an instrument housing operatively connectable to the probe comprising:

a base having first and second compartments separated by a wall, with a passage through the wall connecting the first and second compartments, each compartment having an access opening with both access openings facing in a same direction, the first compartment housing a control circuit for connecting to the sensor, the second compartment housing terminals for connection to external controls, the control circuit being connected to the terminals via a conductor passing through the passage, and a through opening in the first compartment for electrically connecting the control circuit to the probe;

a connector mounted to the base at the opening and to the probe, and first and second covers for selectively closing the respective first and second compartment access openings.

13. The instrument housing of claim 12 wherein the through opening comprises a cylindrical opening defining a cylindrical axis and wherein the axis is at approximately a forty-five degree angle relative to a plane of the access openings.

14. The instrument housing of claim 12 wherein a connector is mounted to the through opening, the connector having a union nut for threading to the sensor at any angular orientation.

15. The instrument housing of claim 12 wherein the passage is sealed with an epoxy sealant.

16. The instrument housing of claim 12 wherein the base includes a conduit opening into the second compartment.

17. The instrument housing of claim 12 wherein the first cover includes a through opening closed by a glass cover so that a display of said control circuit is visible.

18. The instrument housing of claim 12 the connector comprises a high frequency connector having a sleeve with a cable therein wound in a coil, a first end of the cable being connected to the control circuit and a second end of the cable being connected to the probe.

19. The instrument housing of claim 18 wherein probe comprises a coaxial probe and the cable comprises a coaxial cable.

20. The instrument housing of claim 18 wherein the cable comprises a shielded cable.

21. The instrument housing of claim 18 wherein the cable is approximately four feet in length.

* * * * *